United States Patent
Gotoh et al.

(10) Patent No.: US 6,265,309 B1
(45) Date of Patent: Jul. 24, 2001

(54) CLEANING AGENT FOR USE IN PRODUCING SEMICONDUCTOR DEVICES AND PROCESS FOR PRODUCING SEMICONDUCTOR DEVICES USING THE SAME

(75) Inventors: Hideto Gotoh; Tsuyoshi Matsui; Takayuki Niuya, all of Ibaraki-ken; Tetsuo Aoyama, Niigata-ken; Taketo Maruyama, Niigata-ken; Tetsuya Karita, Niigata-ken; Kojiro Abe, Niigata-ken; Fukusaburou Ishihara; Ryuji Sotoaka, both of Ibaraki-ken, all of (JP)

(73) Assignees: Mitsubishi Gas Chemicals Co., Inc., Tokyo (JP); Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/309,076

(22) Filed: May 10, 1999

(30) Foreign Application Priority Data

May 14, 1998 (JP) .................................................. 10-132228

(51) Int. Cl.[7] .............................. H01L 21/02; B08B 3/08; C25F 3/12
(52) U.S. Cl. .......................... 438/637; 438/689; 438/906; 134/1.3; 510/175; 510/176; 510/405; 510/420; 510/465; 510/504
(58) Field of Search .................... 510/175, 176, 510/405, 420, 465, 504; 134/1.3; 438/637, 689, 906

(56) References Cited

U.S. PATENT DOCUMENTS

| 5,279,771 | 1/1994 | Lee ........................................ 252/548 |
| 5,334,332 | 8/1994 | Lee ........................................ 252/548 |
| 5,571,447 | * 11/1996 | Ward et al. ........................... 510/206 |
| 5,911,835 | 6/1999 | Lee et al. .............................. 134/1.3 |
| 5,972,862 | * 10/1999 | Torii et al. ........................... 510/175 |

FOREIGN PATENT DOCUMENTS

| 64-88548 | 4/1989 | (JP) . |
| 4-289866 | 10/1992 | (JP) . |
| 6-222573 | 8/1994 | (JP) . |
| 6-266119 | 9/1994 | (JP) . |

* cited by examiner

Primary Examiner—Mark Kopec
Assistant Examiner—Brian P. Mruk
(74) Attorney, Agent, or Firm—Frishauf, Holtz, Goodman, Langer & Chick, P.C.

(57) ABSTRACT

A cleaning agent for use in producing semiconductor devices. The cleaning agent is an aqueous solution containing (A) a fluorine-containing compound, (B) a salt of boric acid, (C) a water-soluble organic solvent, and optionally, (D) a specific quaternary ammonium salt or (D') a specific ammonium salt of an organic carboxylic acid or a specific amine salt of an organic carboxylic acid. The polymeric deposit inside and around the via holes and on the side wall of the conductive line pattern formed during the dry etching process can be effectively removed by using the cleaning agent without affecting the dimensions of the via holes and the conductive line pattern.

24 Claims, 6 Drawing Sheets

CLEANING AGENT FOR USE IN PRODUCING SEMICONDUCTOR DEVICES AND PROCESS FOR PRODUCING SEMICONDUCTOR DEVICES USING THE SAME

BACKGROUND OF THE INVENTION

1. Field of the Invention

The present invention relates to a cleaning agent for use in producing semiconductor devices and a process for producing semiconductor devices using the cleaning agent. In the process of forming a via hole (through hole formed in an insulation film or an interlaminar insulation film to interconnect a lower electrically conductive line pattern and an upper electrically conductive line pattern) and an electrically conductive line pattern on a semiconductor substrate by dry etching in the production of semiconductor devices, a polymeric substance deposits and adheres inside and around the via hole and on the side wall of the conductive line pattern. Therefore, more particularly, the present invention relates to a cleaning agent which can effectively remove such a polymeric deposit without changing the prescribed dimensions of the via hole and the conductive line pattern, and a process for producing semiconductor devices in which the polymeric deposit is effectively removed by the cleaning agent thereby providing high quality semiconductor devices.

2. Description of the Related Arts

In recent semiconductor devices such as ultra-large scale integrated circuits (ULSI), a very small and precise dimension as small as 0.5 $\mu$m or less is required to form the circuit patterns.

To meet the above strict requirement in the dimension, the use of a dry etching technique is inevitable in the production of semiconductor devices. However, it has been known that the polymeric deposit containing an etching gas component as well as a component of a film being patterned by dry etching and a component of resist is accumulated at the etched portion as the etching process proceeds. When the polymeric deposit is left remaining, in particular, inside and around the via hole, an upper conductive line pattern and a lower conductive line pattern are connected through the via hole with an increased contact resistance or connected defectively to result in a significant deterioration in the reliability of the semiconductor device. Therefore, the polymeric deposit should be removed sufficiently.

It has been known that the polymeric deposit can be removed by cleaning with a cleaning agent containing hydrofluoric acid or a cleaning agent containing hydrofluoric acid and ammonium fluoride. This method is effective when the lower conductive line pattern is made of a material, such as silicon, tungsten, tungsten-titanium alloys and titanium nitride, which is relatively resistant to corrosion by a fluorine compound. However, when made of a material, such as aluminum and an aluminum alloy containing copper, which is relatively less resistant to corrosion by a fluorine compound, the cleaning agent markedly corrodes and dissolves the conductive line pattern. This makes the electrically sufficient connection between the lower conductive line pattern and the upper conductive line pattern through the via hole impossible, and the electric reliability of the semiconductor device is entirely lost.

Moreover, a cleaning agent containing hydrofluoric acid or a cleaning agent containing hydrofluoric acid and ammonium fluoride is likely to cause corrosion of the insulation film having the via hole, thereby making the hole size larger than the intended size. For example, it has been known that a SOG (spin-on-glass) film made of an organic material and/or an inorganic material, which is one of the insulation films recently coming to be widely used as a smoothing film having a low dielectric constant, easily reacts with a fluorine compound to result in corrosion.

It has been proposed that the polymeric deposit can be removed by a resist remover containing an alkanolamine as the main component (Japanese Patent Application Laid-Open No. 64-88548 and Japanese Patent Application Laid-Open No. 6-222573, etc.) or a resist remover containing an alkanolamine as the main component and a reducing agent as an auxiliary agent (Japanese Patent Application Laid-Open No. 4-289866 and Japanese Patent Application Laid-Open No. 6-266119, etc.). However, the removal of the polymeric deposit by these conventional resist removers frequently requires a heating process in which the electrically conductive line and the insulation films are likely corroded by the action of the resist remover and the heat.

Thus, no effective cleaning method has yet been found for removing the polymeric deposit inside and around the via hole when a SOG film and a conductive line made of aluminum or an aluminum alloy containing copper are exposed to the inner surface of the via hole.

When a film made of aluminum or an aluminum alloy containing copper is subjected to dry etching for forming the conductive line pattern, the polymeric substance deposits on the side wall of the conductive line pattern. Similarly to the polymeric deposit inside and around the via hole, the polymeric deposit on the side wall of the conductive line pattern is not easily removed. Moreover, radicals and ions of chlorine entered into the polymeric deposit react with the moisture absorbed from the surrounding atmosphere during the standing after the etching. As a result thereof, acids are formed and corrode the conductive line pattern. This causes significant adverse effects such as breaking of the conductive line and a short-circuit due to the breaking.

To prevent such a corrosion of conductive line pattern, there has been proposed a method of washing away the radicals and ions by a cleaning treatment using ultra-pure water after dry etching. However, the polymeric deposit on the side wall cannot be removed by this method. Also, complete removal of the radicals and ions remaining in the polymeric deposit is very difficult. Therefore, the corrosion of the conductive line pattern cannot be avoided.

Removal of the polymeric substance deposited during etching of a titanium film or a tungsten film is also difficult. A cleaning treatment by a cleaning agent containing hydrofluoric acid or a cleaning agent containing hydrofluoric acid and ammonium fluoride may remove the polymeric deposit. However, tungsten, titanium, tungsten alloys, titanium alloys, titanium-tungsten alloys and titanium nitride are not sufficiently resistant to corrosion by the fluorine compounds although somewhat resistant thereto. Therefore, the separation of the conductive line pattern, for example, may occur due to a partial corrosion of the conductive line pattern to reduce the electric reliability. When the polymeric deposit is left unremoved, adjacent conductive lines come to contact with each other through the polymeric deposit by the pressure from a film being deposited thereon in the subsequent step, thereby likely to cause a short-circuit and other troubles.

SUMMARY OF THE INVENTION

Accordingly, an object of the present invention is to effectively remove the polymeric substance deposited inside and around hole patterns such as via holes without broadening the hole size to ensure the intended dimension.

Another object of the present invention is to sufficiently remove the polymeric substance deposited during the etching process on the side wall of the conductive line pattern.

A still another object of the present invention is to provide a cleaning agent for use in producing semiconductor devices, which meets the above objects.

A still another object of the present invention is to provide a cleaning agent for use in producing semiconductor devices, which does not corrode various types of films such as silicon oxide film, SOG film and silicon nitride film, silicon and materials for the electrically conductive line.

A still another object of the present invention is to provide a process for producing semiconductor devices, which comprises a step of cleaning the etched area with the above cleaning agent.

As a result of extensive studies in view of the above objects, the inventors have found that an aqueous solution comprising water, a fluorine-containing compound, a salt of boric acid, a water-soluble organic solvent, and optionally a specific quaternary ammonium salt or a specific ammonium or amine salt of an organic carboxylic acid can easily remove the polymeric deposit formed during the dry etching process without corroding silicon oxide films, SOG film, silicon nitride films, silicon and the material for the conductive line. By using the above aqueous solution, the polymeric deposit inside and around the via hole, which have been difficult to be removed by conventional methods, can be removed easily while ensuring the intended dimension of the via hole. The polymeric deposit formed during the etching process on the side wall of the conductive line pattern can be also easily removed. Therefore, the portion around the via hole can be kept clean without contamination after the step of forming the via hole and the connection of the conductive line patterns can be achieved sufficiently. Also, the conductive line having no corrosion can be formed because the polymeric deposit on the side wall thereof is removed. Therefore, semiconductor devices having high quality and high reliability can be obtained. The present invention has been completed on the basis of these findings.

Thus, the present invention provides:

(1) A first cleaning agent for use in producing semiconductor devices, which comprises an aqueous solution containing (A) a fluorine-containing compound, (B) a salt of boric acid and (C) a water-soluble organic solvent;

(2) A second cleaning agent for use in producing semiconductor devices, which comprises an aqueous solution containing (A) a fluorine-containing compound, (B) a salt of boric acid, (C) a water-soluble organic solvent and (D) a quaternary ammonium salt represented by general formula (I):

$$[(R^1)_3N-R^2]^+_a X^{a-} \quad (I)$$

wherein each $R^1$ independently represents an alkyl group having 1 to 4 carbon atoms, $R^2$ represents an alkyl group having 1 to 4 carbon atoms or a hydroxyalkyl group having 1 to 4 carbon atoms, $X^{a-}$ represents an inorganic or organic anion having a valency of "a", and a subscript "a" represents the same number as that of the superscript "a" in $X^{a-}$;

(3) A third cleaning agent for use in producing semiconductor devices, which comprises an aqueous solution containing (A) a fluorine-containing compound, (B) a salt of boric acid, (C) a water-soluble organic solvent and (D') an ammonium salt of an organic carboxylic acid and/or an amine salt of an organic carboxylic acid represented by general formula (II):

$$Z-[COONH_{4-n}(R^3)_n]_m \quad (II)$$

wherein Z represents hydrogen atom or a monovalent to tetravalent hydrocarbon group having 1 to 18 carbon atoms, each $R^3$ independently represents an alkyl group having 1 to 4 carbon atoms or a hydroxyalkyl group having 2 to 4 carbon atoms, n represents an integer of 0 to 3, m represents an integer of 1 to 4;

(4) A process for producing semiconductor devices, which comprises a step of forming an insulation film on a semiconductor substrate, a step of dry-etching the insulation film into a prescribed pattern and a step of cleaning the resultant product with any one of the first to third cleaning agents described above;

(5) Another process for producing semiconductor devices, which comprises a step of forming a conductive line pattern from a metal material or a semiconducting material on a semiconductor substrate, a step of forming an insulation film on the conductive line pattern, a step of forming a via hole in the insulation film by dry etching and a step of cleaning the resultant product with any one of the cleaning agents described above; and (6) A still another process for producing semiconductor devices, which comprises a step of forming a film of a metal material or a semiconducting material on a semiconductor substrate, a step of dry-etching the film into a conductive line pattern and a step of cleaning the resultant product with any one of the cleaning agents described above.

DESCRIPTION OF THE PREFERRED EMBODIMENTS

Figure 1A:
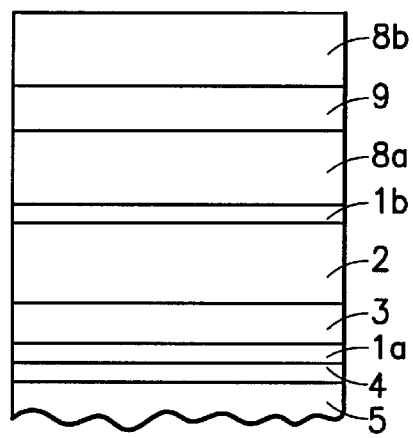
FIGS. 1(a) to 1(c) are schematic cross-sectional views illustrating the process of producing a semiconductor device employed in Example 1.

The first to third cleaning agents of the present invention contain a fluorine-containing compound as the component (A). Examples of the fluorine-containing compound may include hydrofluoric acid, ammonium fluoride, ammonium hydrogenfluoride, acidic ammonium fluoride, methylamine salt of hydrogen fluoride, ethylamine salt of hydrogen fluoride, propylamine salt of hydrogen fluoride, tetramethylammonium fluoride, etc. These may be used alone or in combination of two or more as the component (A).

The content is not particularly limited and may be selected suitably as desired. Preferably, the content is 0.1 to 15% by weight based on the total amount of the cleaning agent. A content less than 0.1% by weight is not preferable, because the rate of removing the polymeric deposit is small. When the content exceeds 15% by weight, the conductive line tends to be corroded. In view of the balance between the rate of removing the polymeric deposit and the effect of suppressing corrosion of the conductive line, the content of the fluorine-containing compound is more preferably 0.5 to 10% by weight.

A salt of boric acid is contained as the component (B) in the first to third cleaning agents of the present invention. Examples of the salt of boric acid may include an ammonium borate such as ammonium metaborate, ammonium tetraborate, ammonium pentaborate and ammonium octaborate; monomethylammonium borate; monoethylammonium borate; dimethylammonium borate; diethylammonium borate; trimethylammonium borate; triethylammonium borate; tetramethylammonium borate; and tetraethylammonium borate. These salts may be used alone or in combination of two or more as the component (B).

The content is not particularly limited and is selected suitably as desired. Preferably, the content is 0.1 to 15% by weight based on the total amount of the cleaning agent. When the content is less than 0.1% by weight, the effect of suppressing corrosion of SOG film is not sufficiently exhibited. When the content exceeds 15% by weight, the rate of removing the polymeric deposit tends to be small. In view of the balance between the effect of suppressing corrosion of SOG film and the rate of removing the polymeric deposit, the content is more preferably 0.1 to 10% by weight.

The component (C) for the first to third cleaning agents of the present invention is a water-soluble organic solvent. Examples of the water-soluble organic solvent may include an amide such as formamide, N-methylformamide, N,N-dimethylformamide, N,N-dimethylacetamide and N-methylpyrrolidone; a lactone such as y-butyrolactone; an alcohol such as methanol, ethanol, isopropyl alcohol and ethylene glycol; an ester such as methyl acetate, ethyl acetate, butyl acetate, methyl lactate and ethyl lactate; a glycol ether such as ethylene glycol monobutyl ether, diethylene glycol monomethyl ether and diethylene glycol monoethyl ether; and a sulfur compound such as dimethylsulfoxide and sulfolane. These water-soluble organic solvents may be used alone or in combination of two or more.

The content is not particularly limited and is selected suitably as desired. Preferably, the content is 5 to 80% by weight based on the total amount of the cleaning agent. When the content is less than 5% by weight, the conductive line tends to be corroded and the viscosity of the cleaning agent increases to deteriorate the workability. When the content exceeds 80% by weight, the rate of removing the polymeric deposit tends to become small. In view of the balance between the effect of suppressing corrosion of the conductive line, the viscosity of the cleaning agent and the rate of removing the polymeric deposit, the content is more preferably 10 to 70% by weight.

The second cleaning agent contains, in addition to the components (A), (B) and (C), a component (D) of a quaternary ammonium salt represented by general formula (I):

In the formula (I), each $R^1$ independently represents an alkyl group having 1 to 4 carbon atoms. The alkyl group may be a linear alkyl group or a branched alkyl group. Examples of the alkyl group may include methyl group, ethyl group, n-propyl group, isopropyl group, n-butyl group, isobutyl group, sec-butyl group and tert-butyl group. $R^2$ represents an alkyl group having 1 to 4 carbon atoms or a hydroxyalkyl group having 1 to 4 carbon atoms. The alkyl group and the hydroxyalkyl group may be linear or branched. Example of the alkyl group may be the same as in the groups for $R^1$. Examples of the hydroxyalkyl group may include 2-hydroxyethyl group, 2-hydroxypropyl group and 3-hydroxybutyl group. $X^{a-}$ represents an inorganic or organic anion having a valency of "a". Examples of the inorganic anion may include a halide ion, sulfate ion, nitrate ion, carbonate ion, hydrogencarbonate ion and phosphate ion. Examples of the organic anion may include formate ion, acetate ion, propionate ion, butyrate ion, oxalate ion, malonate ion, maleate ion, fumarate ion, citraconate ion, benzoate ion, toluate ion, phthalate ion, acrylate ion and methylsulfate ion.

Examples of the quaternary ammonium salt represented by formula (I) may include tetramethylammonium hydrogencarbonate, tetramethylammonium carbonate, tetramethylammonium formate, tetramethylammonium acetate, tetramethylammonium propionate, tetramethylammonium phosphate, tetramethylammonium sulfate, tetramethylammonium oxalate, tetramethylammonium malonate, tetramethylammonium maleate, tetramethylammonium fumarate, tetramethylammonium citraconate, tetramethylammonium benzoate, tetramethylammonium toluate, tetramethylammonium phthalate, tetramethylammonium acrylate, trimethyl(2-hydroxyethyl)ammonium hydrogencarbonate, trimethyl(2-hydroxyethyl)ammonium carbonate, trimethyl(2-hydroxyethyl)ammonium formate, trimethyl(2-hydroxyethyl)ammonium acetate, trimethyl(2-hydroxyethyl)ammonium benzoate, trimethyl(2-hydroxyethyl)ammonium phthalate, tetraethylammonium hydrogencarbonate, tetraethylammonium carbonate, tetraethylammonium formate, tetraethylammonium acetate, tetrapropylammonium formate, tetrapropylammonium acetate, tetrabutylammonium formate, tetrabutylammonium acetate, trimethyl(2-hydroxyethyl)ammonium phosphate and trimethyl(2-hydroxyethyl)ammonium sulfate.

The quaternary ammonium salt for the component (D) may be used alone or in combination of two or more. The content is not particularly limited and is selected suitably as desired. Preferably, the content is 1 to 30% by weight based on the total amount of the cleaning agent. When the content is less than 1% by weight, the wiring tends to be corroded. When the content exceeds 30% by weight, the rate of removal of the polymeric deposit tends to become small. In view of the balance between the effect of suppressing corrosion of the wiring and the rate of removal of the polymeric deposit, the content is more preferably 2 to 20% by weight.

The third cleaning agent of the present invention contain, in addition to the components (A), (B) and (C), a component (D) of an ammonium salt of an organic carboxylic acid and/or an amine salt of an organic carboxylic acid represented by general formula (II):

In the formula (II), Z represents hydrogen atom or a monovalent to tetravalent hydrocarbon group having 1 to 18 carbon atoms. Examples of the hydrocarbon group may include a saturated or unsaturated aliphatic group, a saturated or unsaturated alicyclic group, and an aromatic group. Examples of the saturated or unsaturated aliphatic group may include a residual group obtained by removing a carboxyl group or carboxyl groups from an aliphatic carboxylic acid such as acetic acid, propionic acid, butyric acid, valeric acid, heptanoic acid, lauric acid, palmitic acid, stearic acid, acrylic acid, oleic acid, oxalic acid, malonic acid, maleic acid, fumaric acid, citraconic acid, succinic acid, adipic acid, azelaic acid, sebacic acid, decanedicarboxylic acid and butanetetracarboxylic acid. Examples of the saturated or unsaturated alicyclic group may include a residual group obtained by removing a carboxyl group or carboxyl groups from an alicyclic carboxylic acid such as cyclohexanemonocarboxylic acid, cyclohexane-1,4-dicarboxylic acid, cyclohexane-1,2-dicarboxylic acid, tetrahydrobenzoic acid, tetrahydrophthalic acid and 1,3,5-trimethylcyclohexane-1,3,5-tricarboxylic acid. Examples of the aromatic group may include a residual group obtained by removing a carboxyl group or carboxyl groups from an aromatic carboxylic acid such as benzoic acid, toluic acid, phthalic acid, trimellitic acid, pyromellitic acid, phenylacetic acid and phenylpropionic acid. $R^3$ represents an alkyl group having 1 to 4 carbon atoms or a hydroxyalkyl group having 2 to 4 carbon atoms. The alkyl group may be linear or branched. Examples of the alkyl group may include methyl group, ethyl group, n-propyl group, isopropyl group, n-butyl group, isobutyl group, sec-butyl group and tert-butyl group. Examples of the hydroxyalkyl group may include 2-hydroxyethyl group, 2-hydroxypropyl group, 3-hydroxypropyl group, 2-hydroxybutyl group, 3-hydroxybutyl group and 4-hydroxybutyl group. The subscript "n" represents an integer of 0 to 3 and the subscript "m" represents an integer of 1 to 4. When "n" is 2 or 3, a plurality of $R^3$ may be the same or different.

Examples of the ammonium salt of an organic carboxylic acid represented by formula (II) may include ammonium formate, ammonium acetate, ammonium propionate, ammonium butyrate, ammonium valerate, ammonium heptanoate, ammonium laurate, ammonium palmitate, ammonium stearate, ammonium acrylate, ammonium oxalate, ammonium malonate, ammonium maleate, ammonium fumarate, ammonium citraconate, ammonium succinate, ammonium adipate, ammonium azelate, ammonium sebacate, ammonium benzoate, ammonium toluate, ammonium phthalate, ammonium trimellitate and ammonium pyromellitate.

Examples of the amine salt of an organic carboxylic acid represented by formula (II) may include monomethylamine formate, dimethylamine formate, trimethylamine formate, monomethylamine acetate, dimethylamine acetate, trimethylamine acetate, monomethylamine benzoate, dimethylamine benzoate, trimethylamine benzoate, monoethylamine benzoate, diethylamine benzoate, triethylamine benzoate, ethanolamine formate, ethanolamine acetate, ethanolamine propionate and ethanolamine benzoate.

The ammonium salts and the amine salts mentioned above may be used alone or in combination of two or more as the component (D'). The content is not particularly limited and is selected suitably as desired. Preferably, the content is 1 to 30% by weight based on the total amount of the cleaning agent. When the content is less than 1% by weight, the conductive line tends to be corroded. When the content exceeds 30% by weight, the rate of removing the polymeric deposit tends to become small. In view of the balance between the effect of suppressing corrosion of the conductive line and the rate of removing the polymeric deposit, the content of the component (D') is more preferably 2 to 20% by weight.

The cleaning agent of the present invention may contain, if desired, the component (D) and the component (D') simultaneously. For the reason mentioned above, the total content of the component (D) and the component (D') is preferably 1–30% by weight, more preferably 2–20% by weight based on the total amount of the cleaning agent.

Each of the first to third cleaning agents may contain, if desired, a surfactant as a component (E) to increase the rate of removing the polymeric deposit. Examples of the surfactant include anionic surfactants such as an ester salt of alkylsulfuric acid, an ester salt of polyoxyethylenealkylsulfuric acid, an ester salt of alkylarylsulfuric acid, a salt of alkylbenzenesulfonic acid, a salt of alkylnaphthalenesulfonic acid, a salt of alkylphosphoric acid and an ester of polyoxyethylenealkylphosphoric acid; a cationic surfactant such as a salt of alkylamine, a quaternary ammonium salt and an amine oxide; an ampholytic surfactant such as alkylbetaine and substituted imidazolinium betaine; a nonionic surfactant such as polyoxyethylenealkylamine, polyoxyethylene-fatty acid ester, glycerol-fatty acid ester, polyoxyethylenesorbitol-fatty acid ester, polyoxyethylenesorbitan-fatty acid ester, polyoxyethylene-polyoxypropylene block copolymer, polyoxyethylene derivatives, polyoxyethylene aryl ether, polyoxyethylene alkyl ether, acetylene alcohol, alkylpolyoxyethylenephosphoric acid ester, arylpolyoxyethylene-phosphoric acid ester and alkanolamide of fatty acid; a fluorine surfactant such as salt of perfluoroalkylsulfonic acid, salt of perfluoroalkylcarboxylic acid, quaternary perfluoroalkylammonium salt, perfluoroalkylpolyoxyethyleneethanol and fluorinated alkyl ester; and a silicon surfactant such as alkyleneoxide chain-containing alkyl ester of orthosilicic acid and alkyleneoxide chain-containing alkyl ester of polysilicic acid.

The surfactant may be used alone or in combination of two or more. The content is not particularly limited and is selected suitably as desired. Preferably, the content is 0.001 to 1% by weight based on the total amount of the cleaning agent. When the content is less than 0.001% by weight, the effect of increasing the rate of removing the polymeric deposit is not sufficiently obtained. A content exceeding 1% by weight is uneconomical, because no further increase in the rate of removing the polymeric deposit is obtained. In view of the effect of increasing the rate of removing the polymeric deposit and the production cost, the content of the surfactant is more preferably 0.01 to 0.5% by weight.

The cleaning agent of the present invention having the above chemical composition removes the polymeric deposit inside and around the hole pattern such as via hole in the process of producing semiconductor devices while ensuring the intended dimension of the hole pattern. Moreover, the cleaning agent sufficiently removes the polymeric deposit formed on the side wall of the conductive line pattern and does not corrode silicon oxide film, SOG film, silicon nitride film, silicon and the material for the conductive line.

The process for producing semiconductor devices of the present invention will be described below.

In the first embodiment of the process, a metal film is formed on a semiconductor substrate, and then, the metal film is made into the conductive line pattern. On the conductive line pattern, a single-layered insulation film or a laminate insulation film comprising at least one of silicon oxide film, SOG film and silicon nitride film is formed and the via hole are formed by dry etching in the insulation film. Then, the etched product is subjected to the cleaning treatment by any of the first to third cleaning agents.

In the second embodiment of the process, a metal film is formed on a semiconductor substrate, and then, the metal film is dry-etched into the conductive line pattern. Then, the etched product is subjected to the cleaning treatment by any of the first to third cleaning agents.

More specifically, in the first embodiment, the metal film for forming the conductive line pattern is first formed on the semiconductor substrate. A substrate conventionally used in the production of semiconductors may be used as the semiconductor substrate. For example, a silicon wafer having thereon a silicon oxide film as an insulation film is used as the semiconductor substrate. The metal film is formed on the insulation film. Active elements and passive elements may be formed below the insulation film. The material for the metal film may be tungsten, titanium, a tungsten alloy, a titanium alloy, titanium nitride, aluminum or an aluminum alloy containing copper, and the metal film is made of these materials by the vacuum deposition process, the sputtering process or the chemical vapor deposition process (CVD). The metal film may be a single-layered or multilayered structure depending on the intended application. The metal film is made into the conductive line pattern by a known process being described below. On the conductive line pattern, is formed an insulation film. The insulation film may be a single-layered film comprising a BPSG (borophosphosilicate glass) or non-doped CVD silicon oxide film, a laminate film comprising at least two CVD silicon oxide films, a laminate film comprising a CVD silicon oxide film and an SOG smoothing film made of an inorganic material, an organic material or both, or a laminate film comprising at least one of a CVD silicon oxide film, an SOG film and a silicon nitride film. After forming the via hole in the single-layered insulation film or the laminate insulation film by dry etching, the resultant etched product is subjected to the cleaning treatment by the cleaning agent. This process will be described later more specifically.

In the second embodiment, using a material such as tungsten, titanium, a tungsten alloy, a titanium alloy, titanium nitride, aluminum or an aluminum alloy containing copper, a metal film is formed on a substrate by the vacuum deposition process, the sputtering process or the CVD process. The metal film may be in a single-layered or laminated structure depending on the intended application. Then, the metal film is made into the conductive line pattern by a known method being described later and the resultant product is subjected to the cleaning treatment by the cleaning agent.

The formation of the via hole in the first embodiment, the formation of the conductive line pattern in the second embodiment and the cleaning treatment thereafter are described below more specifically.

A resist with a desired pattern is formed on the single-layered insulation film or the laminate insulation film in the first embodiment or on the metal film in the second embodiment. The resist pattern can be formed by various methods and a suitable method is selected depending on the situation. For example, a solution of a negative type photoresist or a positive type photoresist is applied by using a spinner, etc. and dried to form a resist film. The resist film is irradiated with an active light such as ultraviolet ray and far ultraviolet ray through a specific mask by using a reduced projection light exposure apparatus, irradiated with excimer laser light or X-ray through a mask, or scanned by electron beams. Then, a resist pattern is formed by developing the irradiated resist film using a suitable developing liquid.

The insulation film and the metal film is dry-etched using the resist pattern thus formed as the mask. The dry etching includes various methods, and a typical example thereof is plasma etching. In the plasma etching, a fluorine-containing gas such as tetrafluoromethane is generally used as the etching gas, although the etching gas and the etching conditions are suitably varied depending on the type of the film to be etched. By the dry etching treatment, the via hole is formed in the first embodiment and the conductive line pattern is formed in the second embodiment.

In the dry etching treatment, the polymeric substance derived from the etching gas, the resist and the film being dry-etched deposits inside and around the via hole or on the side wall of the conductive line pattern.

The resist pattern is then removed. In the present invention, the resist pattern is removed preferably by the ashing using oxygen plasma. The ashing by oxygen plasma may be carried out in the same apparatus as used in the plasma etching except for only changing the gas. Therefore, it is advantageous in view of production cost to combine the plasma etching with the ashing by oxygen plasma because the dry etching process and the ashing process are carried out in the same apparatus. Moreover, when the ashing by oxygen plasma is carried out using an oxygen gas added with 5–20 % by volume of a fluorine-containing gas such as $CF_4$, $CHF_3$, $SF_6$, $NF_3$ and $C_2F_6$, the polymeric deposit is removed quite easily in the subsequent cleaning treatment. The ashing temperature using such a mixed gas is about 15–80° C. for a long-time ashing process for about 2–5 minutes, and about 150–180° C. for a short-time ashing process for about 2–5 seconds. An ashing temperature excessively low results in an insufficient ashing, and corrosion of the conductive line pattern made of, for example, tungsten, etc. may occur when the temperature is excessively high.

After the ashing by oxygen plasma, the polymeric deposit formed in the dry etching process is removed by the cleaning agent of the present invention while maintaining the sizes of the via hole and the conductive line pattern within the intended range. The temperature and the time of the cleaning treatment depend on the state of the polymeric deposit and the type of the film material. Usually, a sufficient cleaning may be achieved at ordinary temperature, for example, at 18–30° C. If the rate of removing the polymeric deposit is too small, the cleaning temperature may be raised by heating to about 40° C. The cleaning time is suitably selected depending on the state of the polymeric deposit, the type of the film material and the cleaning temperature.

The cleaning treatment for removing the polymeric deposits is conducted preferably by dipping a etched product having the via hole and/or the conductive line pattern into the cleaning agent of the present invention because such a process is simplest and a large number of the etched products may be treated simultaneously. The etched product may be treated individually by spraying, showering, pouring or continuously or intermittently dropping the cleaning agent thereonto while rotating the etched product. After the cleaning by dipping treatment or by the individual treatment, the resultant product is rinsed with ultra pure water (de-ionized water, DIW) at ordinary temperature and dried to complete the treatments.

With the above cleaning treatment, the polymeric deposit inside and around the via hole and on the side wall of the conductive line pattern, which is not easily removed by the known methods, can be easily removed without causing corrosion of the metal film and the insulation film.

In the first embodiment, an upper conductive line pattern is formed on the insulation film, which is then connected to the lower conductive line pattern under the insulation film through the via hole thus cleaned to obtain a desired semiconductor device. In the second embodiment, an interlaminar insulation film, for example, is formed on the conductive line pattern thus cleaned to obtain a desired semiconductor device.

As described above, the cleaning agent of the present invention efficiently removes the polymeric deposit inside and around the via hole, which is formed from the etching gas, the resist mask and the film being etched, without affecting the size of the via holes. The polymeric deposit formed on the side wall of the conductive line pattern formed during the dry etching is also efficiently removed by the cleaning agent of the present invention without corroding the conductive line pattern and other films.

The present invention will be described in more detail with reference to the following examples. However, it should be construed that the present invention is not limited to the examples.

EXAMPLE 1

Figure 1B:
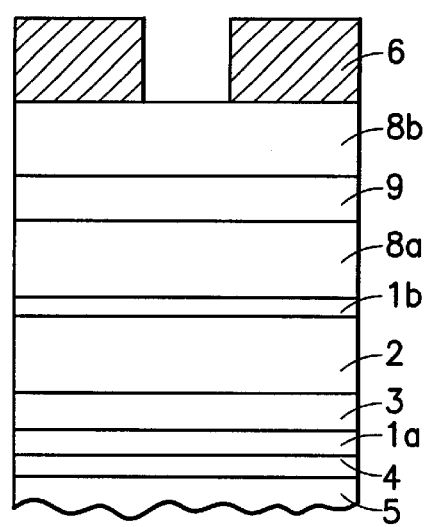
Figure 1C:
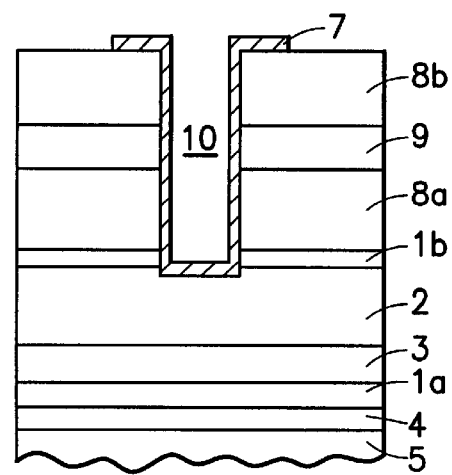

The process for producing semiconductor devices employed in Example 1 is illustrated in FIGS. 1(a) to 1(c).

As shown in FIG. 1(a), a laminated film for constituting a conductive line pattern was formed by successively depositing a titanium film 4, a titanium nitride film 1a, a tungsten film 3, an aluminum-copper alloy film 2 and a titanium nitride film 1b (reflection preventing film) on an interlaminar insulation film 5 (a non-doped CVD silicon oxide film). Then, a second interlaminar insulation film was formed by successively depositing a first tetraethoxysilane (TEOS) film 8a, an SOG film 9 (smoothing film) of an inorganic material and a second TEOS film 8b on the titanium nitride film 1b.

Then, a resist mask 6 for forming a via hole was stacked on the TEOS layer 8b of the second interlaminar insulation film as shown in FIG. 1(b).

The laminate structure of FIG. 1(b) was then dry-etched to remove the films 8a, 9 and 8b at portions not protected by the resist mask 6. The remaining resist mask 6 was removed by ashing and cleaning with an organic solvent to form a via hole 10 with polymeric deposit 7 inside and around the via hole 10 as shown in FIG. 1(c).

Figure 2:
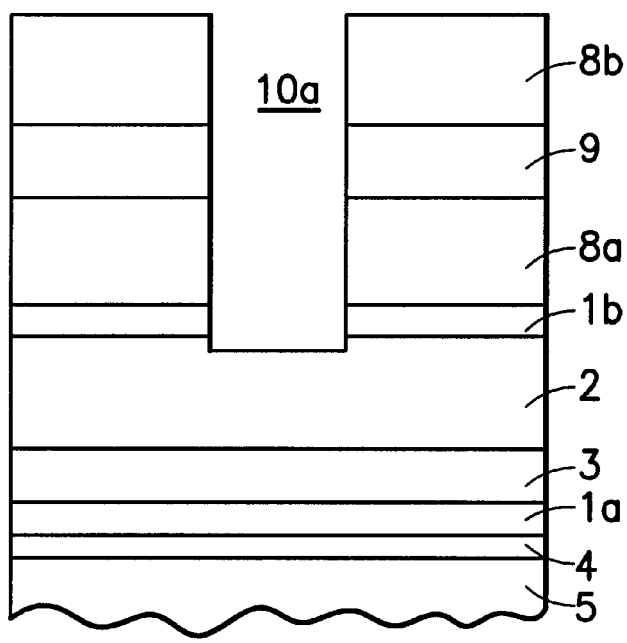
FIG. 2 is a schematic cross-sectional view showing a via hole formed in Example 1.

The laminate product shown in FIG. 1(c) was subjected to a cleaning treatment at 23° C. for 5 minutes using a cleaning agent of the present invention comprising 4% by weight of ammonium fluoride, 1% by weight of ammonium pentaborate, 35% by weight of dimethylformamide and 60% by weight of water, and then washed with water and dried. The result of observation under a scanning electron microscope (SEM) showed that the polymeric deposit was completely removed, and no corrosion was found at the surfaces of the TEOS films 8a and 8b, the SOG smoothing film 9 and the aluminum-copper alloy film 2, thereby providing a via hole 10a having the prescribed dimension as shown in FIG. 2.

COMPARATIVE EXAMPLE 1

Figure 3:
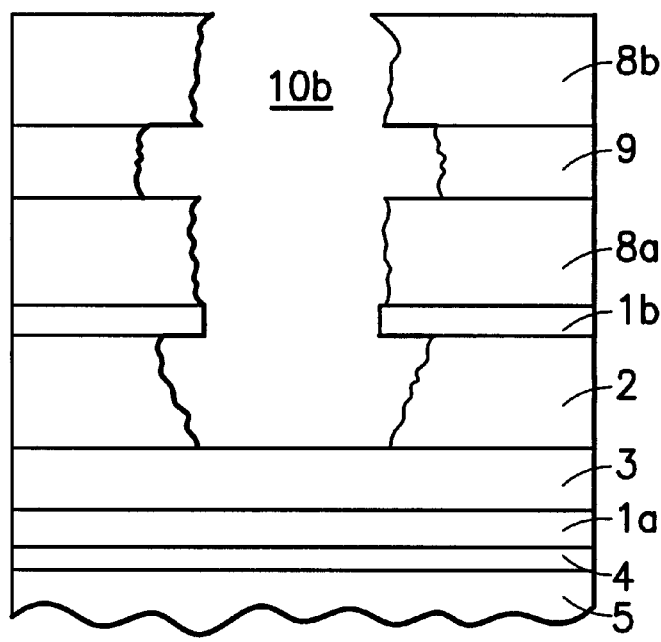
FIG. 3 is a schematic cross-sectional view showing a via hole formed in Comparative Example 1.

The same cleaning treatment as in Example 1 was repeated on a laminate shown in FIG. 1(c) except for conducting the treatment at 23° C. for 10 minutes using a comparative cleaning agent containing 4% by weight of ammonium fluoride, 55% by weight of dimethylformamide and 41% by weight of water. The result of observation under a scanning electron microscope (SEM) showed that the TEOS films 8a and 8b, the SOG smoothing film 9 and the aluminum-copper alloy film 2 were significantly corroded by the cleaning agent to give a via hole 10b having irregularly deformed shape as shown in FIG. 3, although the polymeric deposit was completely removed.

EXAMPLE 2

Figure 4A:
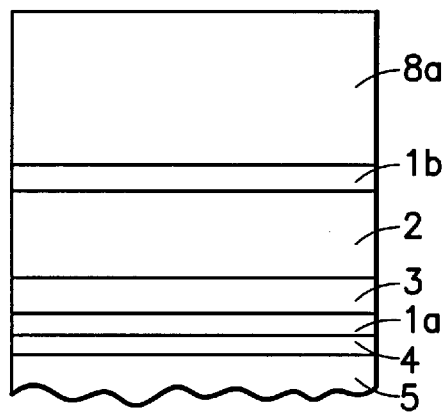
FIGS. 4(a) to 4(c) are schematic cross-sectional views illustrating the process of producing a semiconductor device employed in Example 2.
Figure 4B:
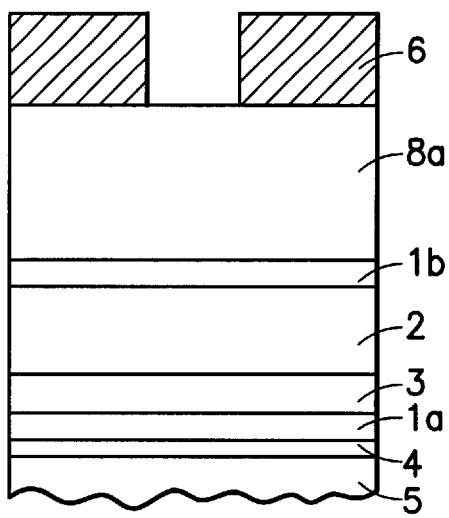
Figure 4C:
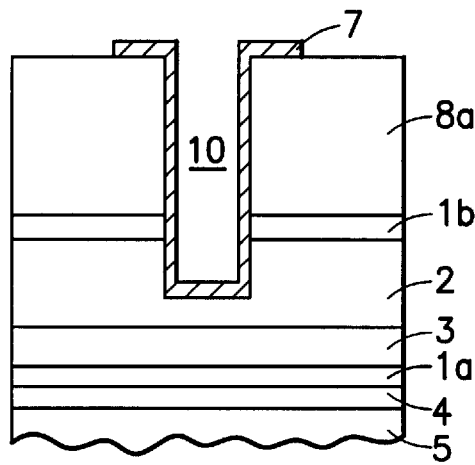

The process for producing semiconductor devices employed in Example 2 is illustrated in FIGS. 4(a) to 4(c).

As shown in FIG. 4(a), a laminated film for constituting the conductive line pattern was formed by successively depositing a titanium film 4, a titanium nitride film 1a, a tungsten film 3, an aluminum-copper alloy film 2 and a titanium nitride film 1b (reflection preventing film) on an interlaminar insulation film 5 (a non-doped CVD silicon oxide film). Then, a second interlaminar insulation film was formed by depositing a TEOS film 8a.

Then, a resist mask 6 for forming via hole was stacked on the TEOS film 8b of the second interlaminar insulation film as shown in FIG. 4(b).

The laminate structure of FIG. 1(b) was then dry-etched to remove the TEOS film 8a at a portion not protected by the resist mask 6. The remaining resist mask 6 was removed by ashing and cleaning with an organic solvent to form a via hole 10 with polymeric deposit 7 inside and around the via hole 10 as shown in FIG. 4(c).

Figure 5:
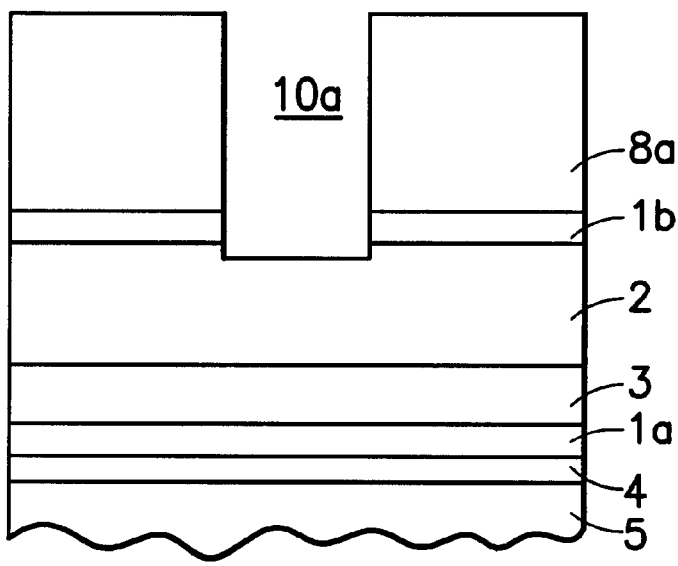
FIG. 5 is a schematic cross-sectional view showing a via hole formed in Example 2.

The laminate product shown in FIG. 4(c) was subjected to a cleaning treatment at 23° C. for 5 minutes using a cleaning agent of the present invention comprising 5% by weight of ammonium fluoride, 1.5% by weight of ammonium pentaborate, 35% by weight of dimethylformamide and 58.5% by weight of water, and then washed with water and dried. The result of observation under a scanning electron microscope (SEM) showed that the polymeric deposit was completely removed, and no corrosion was found at the surfaces of the TEOS film 8a and the aluminum-copper alloy film 2, thereby providing a via hole 10a having the prescribed dimension as shown in FIG. 5.

Comparative Example 2

Figure 6:
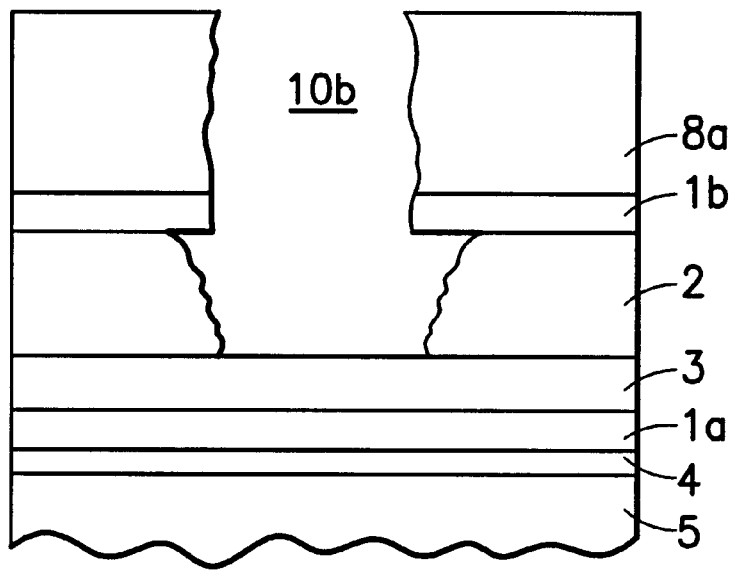
FIG. 6 is a schematic cross-sectional view showing a via hole formed in Comparative Example 2.

The same cleaning treatment as in Example 2 was repeated on a laminate shown in FIG. 4(c) except for conducting the treatment at 23° C. for 10 minutes using a comparative cleaning agent containing 5% by weight of ammonium fluoride, 35% by weight of dimethylformamide and 60% by weight of water. The result of observation under a scanning electron microscope (SEM) showed that the TEOS films 8a and the aluminum-copper alloy film 2 were extremely corroded by the cleaning agent to give a via hole 10b having irregularly deformed shape as shown in FIG. 6, although the polymeric deposit was completely removed.

EXAMPLE 3

The process for producing semiconductor devices employed in Example 3 is illustrated in FIGS. 7(a) to 7(e).

Figure 7A:
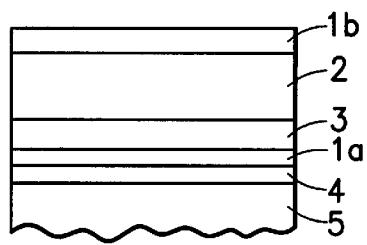
FIGS. 7(a) to 7(e) are schematic cross-sectional views illustrating the process of producing a semiconductor device employed in Example 3.

As shown in FIG. 7(a), a laminate film for constituting the conductive line pattern was formed by successively depositing a titanium film 4, a titanium nitride film 1a, a tungsten film 3, an aluminum-copper alloy film 2 and a titanium nitride film 1b on an interlaminar insulation film 5 (a non-doped CVD silicon oxide film).

Figure 7B:
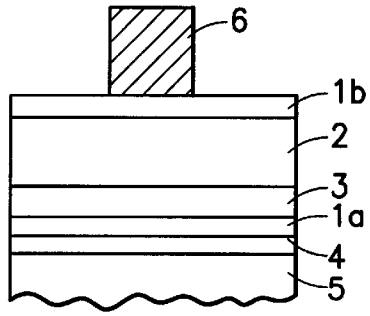

On the titanium nitride reflection-preventing film 1b, was stacked a resist mask 6 for forming a conductive line pattern as shown in FIG. 7(b).

Figure 7C:
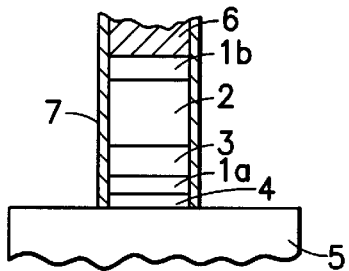

Then, the films 1b, 2, 3, 1a and 4 were removed by dry etching at the portions not protected by the resist mask 6 to form a conductive line pattern as shown in FIG. 7(c). A polymeric deposit 7 was formed during the dry etching.

The remaining resist mask 6 was removed by ashing and cleaning with an organic solvent. The polymeric deposit 7 on the side wall of the conductive line pattern was not removed by this treatment as shown in FIG. 7(d).

Figure 7D:
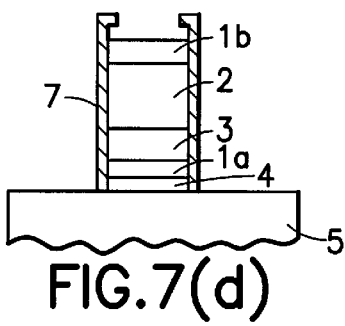
Figure 7E:
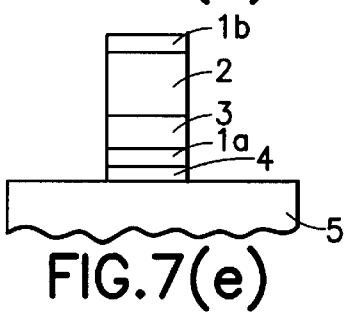

The laminate product shown in FIG. 7(d) was subjected to a cleaning treatment at 23° C. for 5 minutes using a cleaning agent of the present invention comprising 4% by weight of ammonium fluoride, 2% by weight of ammonium pentaborate, 50% by weight of dimethylformamide and 44% by weight of water, and then washed with water and dried. The result of observation under a scanning electron microscope (SEM) showed that the polymeric deposit was completely removed, and no corrosion was found at the surfaces of the films 1b, 2, 3, 1a and 4, thereby providing the conductive line pattern having the prescribed dimension as shown in FIG. 7(e)

EXAMPLE 4

The process for producing semiconductor devices employed in Example 4 is illustrated in FIGS. 8(a) to 8(e).

Figure 8A:
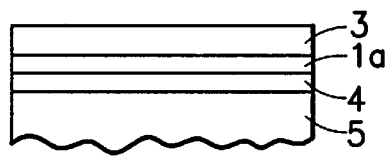
FIGS. 8(a) to 8(e) are schematic cross-sectional views illustrating the process of producing a semiconductor device employed in Example 4.

As shown in FIG. 8(a), a laminate film for constituting the conductive line pattern was formed by successively depositing a titanium film 4, a titanium nitride film 1a and a tungsten film 3 on an interlaminar insulation film 5 (a non-doped CVD silicon oxide film).

Figure 8B:
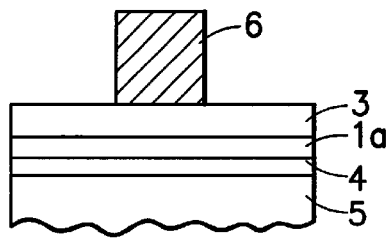

On the tungsten film 3, was stacked a resist mask 6 for forming the conductive line pattern as shown in FIG. 8(b).

Figure 8C:
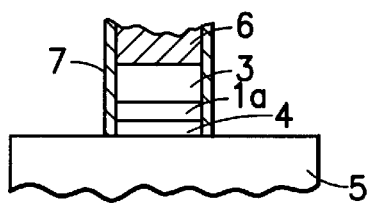

Then, the films 3, 1a and 4 were removed by dry etching at the portions not protected by the resist mask 6 to form the conductive line pattern as shown in FIG. 8(c). A polymeric deposit 7 was formed during the dry etching.

The remaining resist mask 6 was removed by ashing and cleaning with an organic solvent. The polymeric deposit 7 on the side wall of the conductive line pattern was not removed by this treatment as shown in FIG. 8(d).

Figure 8D:
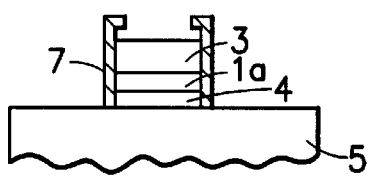
Figure 8E:
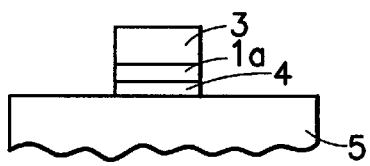

The laminate product shown in FIG. 8(d) was subjected to a cleaning treatment at 23° C. for 10 minutes using a cleaning agent of the present invention comprising 8% by weight of ammonium fluoride, 1% by weight of ammonium pentaborate, 40% by weight of dimethylformamide and 51% by weight of water, and then washed with water and dried. The result of observation under a scanning electron microscope (SEM) showed that the polymeric deposit was completely removed, and no corrosion was found at the surfaces of the films 3, 1a and 4, thereby providing the conductive line pattern having the prescribed dimension as shown in FIG. 8(e).

EXAMPLE 5

The same cleaning treatment as in Example 1 was repeated on a laminate shown in FIG. 1(c) except for conducting the treatment at 23° C. for 10 minutes using a cleaning agent of the present invention containing 4% by weight of ammonium fluoride, 1% by weight of ammonium pentaborate, 5% by weight of tetramethylammonium formate, 35% by weight of dimethylformamide and 55% by weight of water. The result of observation under a scanning electron microscope (SEM) showed that the polymeric deposit was completely removed, and no corrosion was found at the surfaces of the TEOS films 8a and 8b, the SOG smoothing film 9 and the aluminum-copper alloy film 2, thereby providing a via hole having the prescribed dimension.

COMPARATIVE EXAMPLE 3

The same cleaning treatment as in Example 1 was repeated on a laminate shown in FIG. 1(c) except for conducting the treatment at 23° C. for 10 minutes using a comparative cleaning agent containing 4% by weight of ammonium fluoride, 5% by weight of tetramethylammonium formate, 35% by weight of dimethylformamide and 56% by weight of water. The result of observation under a scanning electron microscope (SEM) showed that the TEOS films 8a and 8b, particularly the SOG smoothing film 9, were extremely corroded by the cleaning agent, although the polymeric deposit was completely removed.

EXAMPLE 6

The same cleaning treatment as in Example 1 was repeated on a laminate shown in FIG. 1(c) except for conducting the treatment at 23° C. for 10 minutes using a cleaning agent of the present invention containing 4% by weight of ammonium fluoride, 1% by weight of ammonium pentaborate, 5% by weight of ammonium acetate, 35% by weight of dimethylformamide and 55% by weight of water. The result of observation under a scanning electron microscope (SEM) showed that the polymeric deposit was completely removed, and no corrosion was found at the surfaces of the TEOS films 8a and 8b, the SOG smoothing film 9 and the aluminum-copper alloy film 2, thereby providing a via hole having the prescribed dimension.

EXAMPLE 7

The same cleaning treatment as in Example 1 was repeated on a laminate shown in FIG. 1(c) except for conducting the treatment at 23° C. for 10 minutes using a cleaning agent of the present invention containing 1% by weight of ammonium fluoride, 0.1% by weight of ammonium pentaborate, 10% by weight of ammonium acetate, 40% by weight of dimethylformamide and 48.9% by weight of water. The result of observation under a scanning electron microscope (SEM) showed that the polymeric deposit was completely removed, and no corrosion was found at the surfaces of the TEOS films 8a and 8b, the SOG smoothing film 9 and the aluminum-copper alloy film 2, thereby providing a via hole having the prescribed dimension.

EXAMPLE 8

The same cleaning treatment as in Example 1 was repeated on a laminate shown in FIG. 1(c) except for conducting the treatment at 23° C. for 3 minutes using a cleaning agent of the present invention containing 4% by weight of ammonium fluoride, 1% by weight of ammonium pentaborate, 35% by weight of dimethylformamide, 0.05% by weight of a nonionic surfactant (EP-120A, manufactured by Daiichi Kogyo Seiyaku Co., Ltd.) and 59.95% by weight of water. The result of observation under a scanning electron microscope (SEM) showed that the polymeric deposit was completely removed, and no corrosion was found at the surfaces of the TEOS films 8a and 8b, the SOG smoothing film 9 and the aluminum-copper alloy film 2, thereby providing a via hole having the prescribed dimension.

EXAMPLE 9

The same cleaning treatment as in Example 1 was repeated on a laminate shown in FIG. 1(c) except for conducting the treatment at 23° C. for 5 minutes using a cleaning agent of the present invention containing 2% by weight of ammonium fluoride, 1% by weight of tetramethylammonium borate, 70% by weight of dimethylacetamide and 27% by weight of water. The result of observation under a scanning electron microscope (SEM) showed that the polymeric deposit was completely removed, and no corrosion was found at the surfaces of the TEOS films 8a and 8b, the SOG smoothing film 9 and the aluminum-copper alloy film 2, thereby providing a via hole having the prescribed dimension.

EXAMPLE 10

The same cleaning treatment as in Example 1 was repeated on a laminate shown in FIG. 1(c) except for conducting the treatment at 23° C. for 3 minutes using a cleaning agent of the present invention containing 2% by weight of ammonium fluoride, 1% by weight of tetramethylammonium borate, 70% by weight of dimethylacetamide, 0.05% by weight of a nonionic surfactant (EP-120A, manufactured by Daiichi Kogyo Seiyaku Co., Ltd.) and 26.95% by weight of water. The result of observation under a scanning electron microscope (SEM) showed that the polymeric deposit was completely removed, and no corrosion was found at the surfaces of the TEOS films 8a and 8b, the SOG smoothing film 9 and the aluminum-copper alloy film 2, thereby providing a via hole having the prescribed dimension.

COMPARATIVE EXAMPLE 4

The same cleaning treatment as in Example 1 was repeated on a laminate shown in FIG. 1(c) except for conducting the treatment at 23° C. for 10 minutes using a comparative cleaning agent containing 4% by weight of ammonium fluoride, 5% by weight of ammonium acetate, 35% by weight of dimethylformamide and 56% by weight of water. The result of observation under a scanning electron microscope (SEM) showed that the TEOS films 8a and 8b, particularly the SOG smoothing film 9, were extremely corroded by the cleaning agent, although the polymeric deposit was completely removed.

What is claimed is:

1. A cleaning agent for use in producing semiconductor devices, which consists essentially of an aqueous solution containing (A) 0.1 to 15% by weight based on the total amount of the cleaning agent of at least one fluorine-containing compound selected from the group consisting of hydrofluoric acid, ammonium fluoride, ammonium hydrogenfluoride, acidic ammonium fluoride, methylamine salt of hydrogen fluoride, ethylamine salt of hydrogen fluoride, propylamine salt of hydrogen fluoride and tetramethylammonium fluoride, (B) 0.1 to 15% by weight based on the total amount of the cleaning agent of a salt of boric acid and (C) 5 to 80% by weight based on the total amount of the cleaning agent of a water-soluble organic solvent, and optionally further containing at least one of a quaternary ammonium salt, an ammonium salt of an organic carboxylic acid, an amine salt of an organic carboxylic acid and a surfactant.

2. The cleaning agent according to claim 1, wherein said cleaning agent further contains (D) a quaternary ammonium salt represented by formula (I):

$$[(R^1)_3N\text{—}R^2]^+{}_a X^{a-} \quad (I)$$

wherein each $R^1$ independently represents an alkyl group having 1 to 4 carbon atoms, $R^2$ represents an alkyl group having 1 to 4 carbon atoms or a hydroxyalkyl group having 1 to 4 carbon atoms, $X^{a-}$ represents an inorganic or organic anion having a valency of "a", and a subscript "a" represents the same number as that of the superscript "a" in $X^{a-}$.

3. The cleaning agent according to claim 1, wherein said cleaning agent further contains (D') an ammonium salt of an organic carboxylic acid and/or an amine salt of an organic carboxylic acid represented by formula (II):

$$Z\text{—}[COONH_{4-n}(R^3)_n]_m \quad (II)$$

wherein Z represents hydrogen atom or a monovalent to tetravalent hydrocarbon group having 1 to 18 carbon atoms, each $R^3$ independently represents an alkyl group having 1 to 4 carbon atoms or a hydroxyalkyl group having 2 to 4 carbon atoms, n represents an integer of 0 to 3, and m represents an integer of 1 to 4.

4. The cleaning agent according to claim 1, wherein said cleaning agent further contains (E) a surfactant.

5. The cleaning agent according to claim 2, wherein said cleaning agent further contains (E) a surfactant.

6. The cleaning agent according to claim 3, wherein said cleaning agent further contains (E) a surfactant.

7. The cleaning agent according to claim 1, wherein the salt of boric acid is at least one compound selected from the group consisting of ammonium metaborate, ammonium tetraborate, ammonium pentaborate, ammonium octaborate, monomethylammonium borate, monoethylammonium borate, dimethylammonium borate, diethylammonium borate, trimethylammonium borate, triethylammonium borate, tetramethylammonium borate and tetraethylammonium borate.

8. The cleaning agent according to claim 1, wherein the water-soluble organic solvent is at least one compound selected from the group consisting of formamide, N-methylformamide, N,N-dimethylformamide, N,N-dimethylacetamide, N-methylpyrrolidone, γ-butyrolactone, methanol, ethanol, isopropyl alcohol, ethylene glycol, methyl acetate, ethyl acetate, butyl acetate, methyl lactate, ethyl lactate, ethylene glycol monobutyl ether, diethylene glycol monomethyl ether, diethylene glycol monoethyl ether, dimethylsulfoxide and sulfolane.

9. A process for producing semiconductor devices, which comprises:
   a step of forming an insulation film on a semiconductor substrate;
   a step of dry-etching the insulation film into a prescribed pattern; and
   a step of cleaning the etched product with the cleaning agent as defined in claim 1.

10. A process for producing semiconductor devices, which comprises:
    a step of forming a conductive line pattern from a metal material or a semiconductor material on a semiconductor substrate;
    a step of forming an insulation film on the conductive line pattern;
    a step of forming a via hole in the insulation film by dry etching; and
    a step of cleaning the etched product with the cleaning agent as defined in claim 1.

11. A process for producing semiconductor devices, which comprises:
    a step of forming a film of a metal material or a semiconductor material on a semiconductor substrate;
    a step of dry-etching the film into a conductive line pattern; and
    a step of cleaning the resultant product with the cleaning agent as defined in claim 1.

12. The process according to claim 9, wherein said cleaning agent further contains (D) a quaternary ammonium salt represented by formula (I):

$$[(R^1)_3N\text{—}R^2]^+{}_a X^{a-} \quad (I):$$

wherein each $R^1$ independently represents an alkyl group having 1 to 4 carbon atoms, $R^2$ represents an alkyl group having 1 to 4 carbon atoms or a hydroxyalkyl group having 1 to 4 carbon atoms, $X^{a-}$ represents an inorganic or organic anion having a valency of "a", and a subscript "a" represents the same number as that of the superscript "a" in $X^{a-}$.

13. The process according to claim 10, wherein said cleaning agent further contains (D) a quaternary ammonium salt represented by formula (I):

wherein each $R^1$ independently represents an alkyl group having 1 to 4 carbon atoms, $R^2$ represents an alkyl group having 1 to 4 carbon atoms or a hydroxyalkyl group having 1 to 4 carbon atoms, $X^{a-}$ represents an inorganic or organic anion having a valency of "a", and a subscript "a" represents the same number as that of the superscript "a" in $X^{a-}$.

14. The process according to claim 11, wherein said cleaning agent further contains (D) a quaternary ammonium salt represented by formula (I):

wherein each $R^1$ independently represents an alkyl group having 1 to 4 carbon atoms, $R^2$ represents an alkyl group having 1 to 4 carbon atoms or a hydroxyalkyl group having 1 to 4 carbon atoms, $X^{a-}$ represents an inorganic or organic anion having a valency of "a", and a subscript "a" represents the same number as that of the superscript "a" in $X^{a-}$.

15. The process according to claim 9, wherein said cleaning agent further contains (D') an ammonium salt of an organic carboxylic acid and/or an amine salt of an organic carboxylic acid represented by formula (II):

wherein Z represents hydrogen atom or a monovalent to tetravalent hydrocarbon group having 1 to 18 carbon atoms, each $R^3$ independently represents an alkyl group having 1 to 4 carbon atoms or a hydroxyalkyl group having 2 to 4 carbon atoms, n represents an integer of 0 to 3, and m represents an integer of 1 to 4.

16. The process according to claims 10, wherein said cleaning agent further contains (D') an ammonium salt of an organic carboxylic acid and/or an amine salt of an organic carboxylic acid represented by formula (II):

wherein Z represents hydrogen atom or a monovalent to tetravalent hydrocarbon group having 1 to 18 carbon atoms, each $R^3$ independently represents an alkyl group having 1 to 4 carbon atoms or a hydroxyalkyl group having 2 to 4 carbon atoms, n represents an integer of 0 to 3, and m represents an integer of 1 to 4.

17. The process according to claim 11, wherein said cleaning agent further contains (D') an ammonium salt of an organic carboxylic acid and/or an amine salt of an organic carboxylic acid represented by formula (II):

wherein Z represents hydrogen atom or a monovalent to tetravalent hydrocarbon group having 1 to 18 carbon atoms, each $R^3$ independently represents an alkyl group having 1 to 4 carbon atoms or a hydroxvalkyl group having 2 to 4 carbon atoms, n represents an integer of 0 to 3, and m represents an integer of 1 to 4.

18. The process according to claim 9, wherein said cleaning agent further contains (E) a surfactant.

19. The process according to claim 10, wherein said cleaning agent further contains (E) a surfactant.

20. The process according to claim 11, wherein said cleaning agent further contains (E) a surfactant.

21. The process according to claim 9, wherein said insulation film is:

a silicon oxide film formed by thermal oxidation;

a single or multi-layered silicon oxide film formed by a chemical vapor deposition process;

a laminate film comprising a lowermost silicon oxide film formed by a chemical vapor deposition process, a spin-on-glass film deposited on said lowermost silicon oxide film, and a single or multi-layered silicon oxide film formed on said spin-on-glass film by a chemical vapor deposition process; or a laminate film comprising a lowermost silicon oxide film formed by a chemical vapor deposition process, a spin-on-glass film deposited on said lowermost silicon oxide film, a single or multi-layered silicon oxide film formed on said spin-on-glass film by a chemical vapor deposition process and an uppermost silicon nitride film.

22. The process according to claim 10, wherein said insulation film is:

a silicon oxide film formed by thermal oxidation;

a single or multi-layered silicon oxide film formed by a chemical vapor deposition process;

a laminate film comprising a lowermost silicon oxide film formed by a chemical vapor deposition process, a spin-on-glass film deposited on said lowermost silicon oxide film, and a single or multi-layered silicon oxide film formed on said spin-on-glass film by a chemical vapor deposition process; or a laminate film comprising a lowermost silicon oxide film formed by a chemical vapor deposition process, a spin-on-glass film deposited on said lowermost silicon oxide film, a single or multi-layered silicon oxide film formed on said spin-on-glass film by a chemical vapor deposition process and an uppermost silicon nitride film.

23. The process according to claim 10, wherein said conductive line pattern is made of at least one material selected from the group consisting of tungsten, a tungsten alloy, titanium, a titanium alloy, titanium nitride, aluminum and an aluminum alloy, or at least one semiconducting material selected from the group consisting of a single-crystal silicon and a polycrystalline silicon each doped with phosphorus or boron in an amount of $10^{20}$ to $10^{22}$ atom/cm$^3$.

24. The process according to claim 11, wherein said conductive line pattern is made of at least one material selected from the group consisting of tungsten, a tungsten alloy, titanium, a titanium alloy, titanium nitride, aluminum and an aluminum alloy, or at least one semiconducting material selected from the group consisting of a single-crystal silicon and a polycrystalline silicon each doped with phosphorus or boron in an amount of $10^{20}$ to $10^{22}$ atom/cm$^3$.

* * * * *